United States Patent [19]

Black et al.

[11] Patent Number: 5,032,543

[45] Date of Patent: Jul. 16, 1991

[54] COPLANAR PACKAGING TECHNIQUES FOR MULTICHIP CIRCUITS

[75] Inventors: Jerry G. Black, Lincoln; David K. Astolfi, Littleton; Scott P. Doran, Wakefield; Daniel J. Ehrlich, Lexington, all of Mass.

[73] Assignee: Massachusetts Institute of Technology, Cambridge, Mass.

[21] Appl. No.: 208,058

[22] Filed: Jun. 17, 1988

[51] Int. Cl.$^5$ .................................. H01L 21/56
[52] U.S. Cl. ................................. 437/219; 437/974; 264/272.17; 156/155
[58] Field of Search ............... 437/215, 974, 219; 148/DIG. 135; 264/272.17; 156/155, 300, 280

[56] References Cited

U.S. PATENT DOCUMENTS

| | | | |
|---|---|---|---|
| 3,158,927 | 12/1964 | Saunders | 437/215 |
| 3,258,898 | 7/1966 | Garibotti | 437/215 |
| 3,621,565 | 11/1971 | Sandstrom | 148/DIG. 135 |
| 3,846,198 | 11/1974 | Wen et al. | 148/DIG. 135 |
| 3,959,045 | 5/1976 | Antypas | |
| 4,059,708 | 11/1977 | Heiss, Jr. et al. | 427/96 |
| 4,168,998 | 9/1979 | Hasagawa et al. | 437/974 |
| 4,255,208 | 3/1981 | Deutscher et al. | |
| 4,530,152 | 7/1985 | Roche et al. | 156/155 |
| 4,635,356 | 1/1987 | Ohuchi et al. | 437/215 |
| 4,709,468 | 12/1987 | Wilson | 437/209 |
| 4,711,859 | 12/1987 | Argentini | 437/215 |
| 4,774,194 | 9/1988 | Hokuyou | 437/974 |

FOREIGN PATENT DOCUMENTS

| | | | |
|---|---|---|---|
| 972081 | 7/1975 | Canada | 437/215 |
| 171801 | 2/1986 | European Pat. Off. | |

OTHER PUBLICATIONS

Johnson et al, "Silicon Hybrid Wafer-Scale Package Technology", 1986 IEEE Journal of Solid State Circuits, vol. SC-21, No. 5, Oct. 1986, pp. 845-850.

McDonald et al, "Multilevel Interconnections in Wafer-Scale Integration", J. Vac. Sci. Technol., vol. 4, No. 6, pp. 3127-3137, Nov./Dec. 1986.

*Primary Examiner*—Olik Chaudhuri
*Assistant Examiner*—Andrew Griffin
*Attorney, Agent, or Firm*—Fish & Richardson

[57] ABSTRACT

A method for assembling and interconnecting large, high-density circuits from separately fabricated components, where conventional preassembly device testing, and conventional production techniques, can be employed in an uncomplicated process. A plurality of semiconductor chips are applied connection-side down to a temporary soluble substrate and then encapsulated. The temporary soluble substrate is then dissolved, exposing the connection side of the chips, to which electrical connections can then be made.

34 Claims, 1 Drawing Sheet

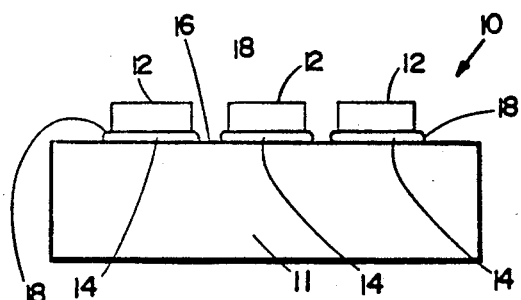
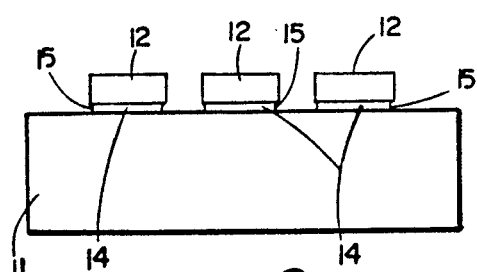
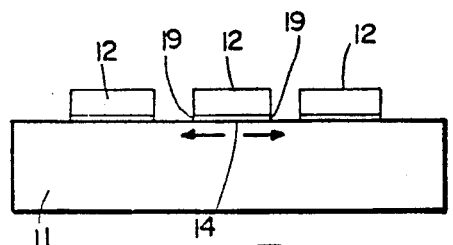
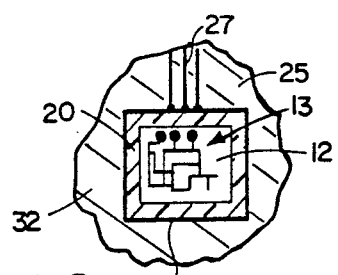
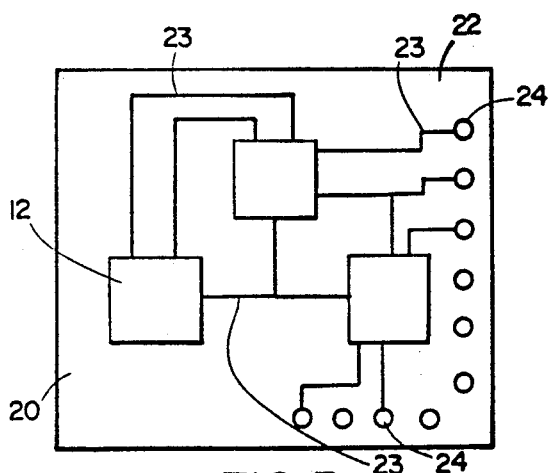
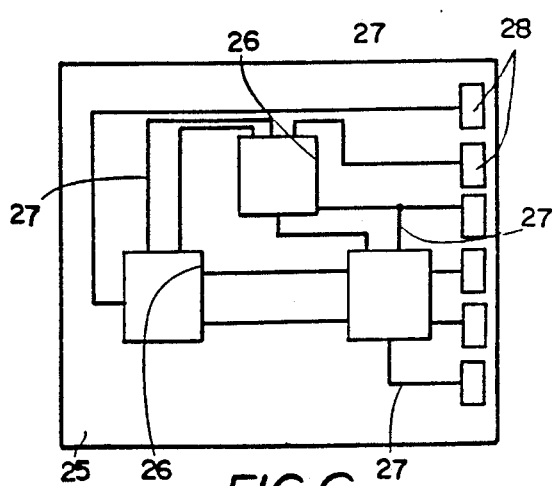
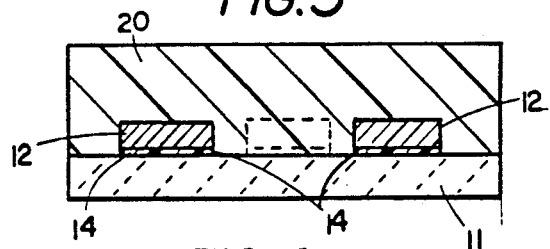
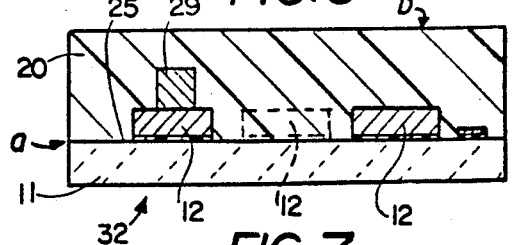

COPLANAR PACKAGING TECHNIQUES FOR MULTICHIP CIRCUITS

The U. S. Government has non-exclusive rights in this invention pursuant to Contract Number F19628 85-C-0002 awarded by the Department of the Air Force.

The present invention relates to coplanar packaging techniques for multichip circuits.

Over the last few decades the semiconductor industry has witnessed a relentless improvement in component and system design. Nevertheless, manufacturers continue to push for ever-increasing circuit density, while improving performance and raising production yield. As a consequence, electronic systems are becoming smaller, faster, and more powerful every year. Integrated circuit densities have thus increased by several orders of magnitude over the last decade, although packaging and interconnect technology has not advanced at the same quick pace.

One of the most popular package modality today is the ubiquitous monolithic dual in-line package (DIP). The DIP commonly is found with lead counts ranging from four to around sixty four pins per device. The DIP is so common, in fact, as to make it nearly impossible to find electronics equipment which does not incorporate DIP integrated circuits.

Equally as common is the tried-and-true board-and-backplane mounting and interconnection technology, where various discrete components and integrated circuits (such as DIPs) are typically mounted on a circuit board with each of the component leads mated with an assigned through hole on the circuit board. Interconnection between components mounted on the circuit board then can be accomplished on the back plane in any of various manners. This technology enables mixing of various circuit types within a single circuit board.

A newer packaging and mounting approach is surface-mount technology (SMT), where the old through-holes are eliminated by mounting and connecting unpackaged chips on the surface of a carrier. High levels of automation can be achieved using SMT while also achieving both substantial reductions in system size and noteworthy increases in system performance. However, SMT manufacturing by and large has not been widely adopted, perhaps because the technology requires a substantial up-front investment in new equipment. Furthermore, SMT does not promise being able to handle the very high lead counts forecast for the very dense chips of the 1990s.

The advance of technology not to be undone, wafer-scale integration has developed as a new way to meet the interconnect demands in very high density circuits. In particular, two distinct wafer-scale implementations have emerged: the monolithic and the hybrid. In the monolithic, chip to chip interconnections are fabricated on the active wafer. In the hybrid, a separate "wafer"-like substrate is used for the interconnection network. Dies are then mounted upon this structure. The substrate can be a regular Si wafer, or made of ceramic or even metallic materials.

In the hybrid approach, while wafer-to-wafer or chip-to-wafer connections are necessary, it does afford a mix and match of technologies on a single wafer. In fact, the ability to mix silicon and gallium arsenide devices will likely grow in significance as gallium arsenide digital integrated circuits and electro-optic devices are integrated into current silicon systems. Hence the hybrid approach should be seen as very promising, even though wafer scale production still retains stringent requirements for elimination of device defects.

A method to take advantage of hybrid wafer level circuit building, while also providing acceptable yield levels, has been proposed by Johnson, et al, in Silicon Hybrid Wafer-Scale Package Technology, 1986 IEEE Journal of Solid State Circuits, Vol. SC-21, No. 5, October 1986, pp. 845-850. In this method, holes are etched in a silicon wafer and metallization is applied to form interchip electrical paths on the wafer before the individual chips are applied to the wafer. At this point, the wafer can be checked for defects. Thereafter, pretested chips are mounted on the pretested wafer. Next, an interlevel dielectric is applied to smooth out chip to wafer topology. Thereafter, vias are opened up for chip-to-wafer electrical interconnection, which is followed by metal deposition and patterning of links to achieve chip-to-wafer interconnection.

One problem with the above method is that rotational and translational misalignment between chip and wafer can occur. Johnson uses photolithographic techniques to solve this problem by creating custom via and link masks to compensate for chip misalignment. Hence, custom links can be laid down in properly oriented vias to accomodate such misalignment. As a result, a high density hybrid integrated circuit can be produced. However, Johnson's process is very complex and is not particularly well suited to highly automated processing.

McDonald et al, in Multilevel Interconnections in Wafer Scale Integration, J. Vac. Sci. Technol. Vol. 4, No. 6, pp. 3127-3137, Nov/Dec 1986, addresses the issues involved in providing large scale interconnects needed to complete a hybridized wafer. In this approach, a wafer transmission module provides a multilayer metallization structure with wafer-scale interconnections. The module includes various layers of metallization, dielectric and vias laid out on a substrate. Chips are mounted on the module at metallized locations, and are connected to its wiring by wire or flip bonding.

McDonald also teaches a particular modified thick-film lift-off process for producing multilayer interconnect structures for densely wired wafer transmission modules. The method steps include: spinning on and curing a planarizing dielectric layer; depositing a release layer of molybdenum or soluble organic film on the wafer and then a thin shield film of aluminum on top; spinning on a pattern definition resist layer; lithographically exposing and etching regions of the aluminum; dry etching the workpiece to open vias; directionally depositing a thick metal layer; and laterally etching away the release layer, which releases the top metal under mild agitation.

Again, the foregoing process is quite complex, and requires extreme planarity between the chips and module to enable functional connection between the chips and the module metallization. It would therefore be advantageous to have a method for assembling and interconnecting large, high-density circuits from separately fabricated components, where conventional pre-assembly device testing, and conventional production techniques, can be employed in an uncomplicated process.

SUMMARY OF THE INVENTION

In accordance with one aspect of the present invention, a packaging method for multichip circuits includes the steps of adhering selected chips onto a soluble substrate, partially encapsulating the workpiece, and releasing the soluble substrate from the partially encapsulated workpiece.

In accordance with another aspect of the present invention, a packaging method for multichip circuits is disclosed including the steps of adhering selected chips onto a soluble substrate, dissolving excess adhesive from the workpiece, moderately heating the workpiece, encapsulating the heated workpiece, curing the encapsulant, dissolving the soluble substrate, and dissolving the adhesive.

In accordance with yet another aspect of the present invention a method is disclosed for assembling and interconnecting large, high-density circuits from separately fabricated components, where conventional pre-assembly testing can be employed. The invention may be practiced with conventional semiconductor processing techniques and equipment in an uncomplicated process.

BRIEF DESCRIPTION OF THE DRAWINGS

FIG. 1 is a side cross-sectional view of a soluble substrate having chips adhered face down onto the substrate.

FIG. 2 is a side cross-sectional view of a soluble substrate having chips adhered face down onto the substrate, where excess adhesive has been dissolved from the workpiece.

FIG. 3 is a side cross-sectional view of a soluble substrate having chips adhered face down onto the substrate, where the workpiece has been submitted to mild heating.

FIG. 4 is a side cross-sectional view of a soluble substrate having chips adhered face down onto the substrate, where the upper portion of the workpiece has been encapsulated.

FIG. 5 is a plan view of the connection side of a completed workpiece with interconnects having been laid down between the chips.

FIG. 6 is a plan view of an interconnect grid for use with the present invention.

FIG. 7 is a side cross-sectional view of a preferred embodiment of the present invention, where a wafer and several chips are mounted in epoxy upon a soluble substrate.

FIG. 8 is a partial view of the connection side of a workpiece, including a chip seated in a window of a waffle.

PREFERRED EMBODIMENT OF THE PRESENT INVENTION

The present invention provides an efficient method for construction of large-area hybrid, multichip electronic packages. The end result enables production of a single, circuit-boardless, epoxy-bound electronic device, housing a combination of highly interconnected semiconductor chips of the same or varying technologies (such as Si, GaAs, etc.). This device may be fabricated as a self-contained circuit or as a component for use in a larger circuit, subsystem or system.

In practice of the present invention, a soluble, such as water-soluble, substrate acts as a removable carrier for the invention. It may be a structurally rigid stand-alone substrate, or may be formed as a thin film layer upon a rigid carrier. In a preferred embodiment, potassium chloride, sodium chloride, or the like, is thermally evaporated to form a thin film salt layer upon a flat, polished substrate, such as upon a standard silicon wafer. (It is believed that a film thickness of 10-20 microns will probably be adequate for most applications.)

In an alternative embodiment, potassium or sodium chloride crystal windows may be employed as a substrate. These items are commercially available with flat polished surfaces suitable for use in the present invention. In either case, a polished surface is beneficial to the invention, as will be explained later.

Turning now to FIG. 1, a side cross-sectional view of an exemplary workpiece 10 is shown where soluble substrate 11 temporarily provides a working surface for application of chips 12, by means of adhesive 14 to the highly polished substrate surface 16. In practice of the present invention, pretested chips 12 are selected for attachment to the solidified soluble carrier 11 (regardless of whether the carrier is a stand alone crystal window or a thin film layer upon a substrate). To each chip, adhesive agent 18 is applied to the chip's active face (i.e., to the connection side of the chip). The adhesive-bearing chip is laid face down onto the soluble substrate in a desired location. This process is repeated until all desired chips have been applied to the substrate. In an alternative embodiment, adhesive can be laid down on the substrate first, with chips to be applied where desired.

The surface tension at the substrate/chip interface will cause the chip to adhere to the substrate. It has been found that it is preferable to use too much rather than too little adhesive during this step. Thermoplastic polymer, commonly known as "white wax", has proven to be an adequate adhesive agent for this process. Spun on PMMA has also given desirable results, although it has a very limited set up time. It will be appreciated, however, that many other various adhesives and glues will be operable within practice of the present invention. In any event, the chosen adhesive, or glue, is to be soluble such that it can be dissolved without dissolving the soluble substrate.

It will be appreciated that as chips 12 have been adhered to the polished surface 16 of soluble substrate 11, an excess collar 18 of adhesive 14 may be formed around the base of chip 12. It is preferable that this collar be removed.

Hence, where the substrate 11 is water-soluble and an adhesive impervious to water is selected, the substrate, with chips 12 affixed, is submitted to a bath of non aqueous solvent, such as acetone, for a period of time long enough to remove collar 18 and also so as to undercut the adhesive 14 at the edges of the chips. Referring to the cross-sectional view of FIG. 2, the workpiece of FIG. 1 is shown after having been bathed in acetone. The bath is continued long enough to produce an undercut 15 of adhesive 14 such as shown at the chip/substrate interface. The purpose of the undercuts will become apparent after the following discussion.

The next step is directed to resolving the adhesive 14 into a very uniform, very thin layer between soluble substrate 11 and chip 12. Hence, substrate 11, with chip 12 adhered to its surface, is placed on a hot plate and mildly heated to 130° C. for one minute. As a result, as the adhesive thins to a uniform thickness, all the chips on the soluble substrate should come to rest at a uniform distance from the surface of the substrate. As a result of this step, the active face of each chip all will lie in the same plane, substantially parallel to the polished substrate surface 18.

Turning to the cross-sectional view of FIG. 3, the heated workpiece of FIG. 2 is shown. It will be thus understood that, as a result of mild heating, adhesive 14 has flowed outwardly toward the edges of chip 12 (see arrows in FIG. 3), thus thinning out the layer of adhesive and also reducing the size of or eliminating undercuts 15. It is even possible that the heated adhesive 14 may flow beyond the edges of chips 12, forming a new collar 19. If such a new collar is formed, it is not fatal by any means, but preferably should be avoided either by means of allowing additional undercutting to occur during the first non-aqueous wash, or by initially applying less adhesive 14 to chip 12.

The thus heated and formed workpiece of FIG. 3 will now be understood to include selected chips 12 adhering to the surface of soluble carrier 11 (whether a soluble substrate or a soluble film on a substrate), where the adhesive has preferably assumed a uniform thickness of about three microns. The resulting circuit-in-the-making is now ready to be encapsulated in a permanent supporting carrier.

Hence, as shown in the cross-sectional view of FIG. 4, an encapsulating compound 20 preferably is applied such that it will establish a top and four sides of the workpiece, the bottom being formed by the soluble carrier for the time being. (Any suitable jig or forms may be used to contain the epoxy while forming the top and sides of the workpiece, as will be appreciated by those skilled in the art. In a preferred embodiment, Masterbond 34CA epoxy was used as the encapsulating compound 20, mixed and cured according to the manufacturer's instructions.)

After the encapsulant 20 is cured, the water-soluble substrate is dissolved by submitting the workpiece to an aqueous bath. After this step, the adhesive is dissolved by submitting the workpiece to a bath of appropriate solvent. Where either white wax or PMMA is used, acetone is found to be a suitable solvent.

The resulting workpiece, which includes various chips held in an epoxy frame, is now ready for application of circuit interconnects. However, a further cleaning step may be needed to remove any encroaching encapsulant away from the contacts on the face of the chips. In such event, plasma ashing is considered to be an adequate conventional means of removing the encroachment.

A completed workpiece 22, as shown in FIG. 5, may now be submitted to appropriate techniques, such as direct-write laser techniques, for connection of the device into any desired circuit. Direct-write laser methods will include both where the laser beam either exposes resist to create a pattern for subsequent lift-off processing or where the laser beam directly deposits metal by local chemical reaction. In any case, interconnects 23 will thus be created to complete various circuits on the device and will also avail such circuits to off-board connection, such as by means of contact pads 24.

In a preferred embodiment, however, an additional step may be followed to facilitate circuit interconnection. Referring to the plan view of FIG. 6, an interconnect grid or waffle 25 is shown having openings or windows 26 defined therein, and also having interconnects 2 and pads 28 applied to the surface thereof, and which may be formed by any standard process. Waffle 25 may be applied to the soluble substrate 11 in the same manner as and in addition to chips 12, all in one general step. More particularly, waffle 25 is adhered face down on substrate 11 as if it were a large chip 12, where chips 12 are then located at an adhered face down to the exposed substrate presented within windows 26.

Referring now to the side cross-sectional view of FIG. 7, it will be appreciated that a preferred workpiece 32, as an alternative to the configuration of FIG. 4, includes waffle 25 and chips 12 adhered to substrate 11 and mounted in an encapsulant 20. Also shown is a metal stud 29 which can be affixed to the rear of a chip 12 for heat sinking purposes.

It should now be clear that there is no requirement in coplanarity of the rear surfaces of waffle 25 or chips 12. However, in practice of the present invention, an extremely high degree of planarity is desirably achieved chip to chip and chip to waffle on the connection side of these devices. The advantage of such coplanarity lies in that the writing or forming of interconnects, whether chip to chip or chip to waffle, will be greatly facilitated. In fact, the reason for selecting a substrate with a polished surface will now have become clear: it further facilitates formation of the workpiece connection-side with sufficient uniformity in the working plane as to greatly aid in the laying down of interconnects. Furthermore, as seen in the partial view of workpiece 32 in FIG. 8, a chip 12 is shown located at a window 26 of waffle 25 in the encapsulated workpiece. Of particular note is that waffle interconnects 27 may be presented to within microns of connection pads 13 of chip 12, with a bar of epoxy 20 located in between. These interconnects, pads, and the epoxy bar are substantially coplanar, such that the application of metallization to connect interconnects 27 and pads 13 across the epoxy bar can be achieved with ease and regularity.

A final step which aids in mounting of the finished workpiece, is to mill or otherwise process the back face "b" of the workpiece so that it is parallel with the newly created coplanar connection surface "a", as illustrated in FIG. 7. In this manner, the finished workpiece may be evenly presented to a particular mechanical stage for further processing, such as for uniform application of circuit interconnects.

While the present invention has been described with respect to specific embodiments, it will be appreciated that various modifications and equivalents of the present invention are within the spirit and scope of the present disclosure althouqh not specifically set forth herein. Nonetheless, it is intended that the present invention be interpreted to cover such modifications and equivalents, limited only by the claims appended hereto.

We claim:

1. A method for assembling and interconnecting a plurality of separately fabricated semiconductor chips comprising the steps of:
    (a) applying a plurality of semiconductor chips, connection-side down, to a soluble substrate;
    (b) encapsulating the product of step (a) on the side of said substrate to which the semiconductor chips have been applied,
    (c) dissolving the soluble substrate from the product of step (b) and thereby exposing the connection-sides of the plurality of chips, and
    (d) applying a pattern of conductive material to the exposed surface to make electrical connections between the plurality of chips.

2. The method of claim 1 wherein said substrate comprises at least a thin film of crystallized salt.

3. The method of claim 2, where said salt is NaCl.

4. The method of claim 2, where said salt is KCl.

5. The method of claim 2, wherein a surface of said crystallized salt is polished.

6. The method of claim 1, further comprising the step (a1) of supplying adhesive between the semiconductor chips and said substrate.

7. The method of claim 1, further comprising the step (a1) of moderately heating the product of step (a).

8. The method of claim 6, further comprising the step (a2) of removing excess adhesive from the product of step (a1).

9. The method of claim 6, further comprising the step (a2) of moderately heating the product of step (a1).

10. The method of claim 9, further comprising the step (a3) of removing excess adhesive from the product of step (a2).

11. The method of claim 10, wherein said adhesive is a polymer.

12. The method of claim 1, wherein epoxy is employed for the encapsulating of step (b).

13. The method of claim 12, further comprising the step (b1) of curing the product of step (b).

14. The method of claim 7, wherein epoxy is employed for the encapsulating of step (b).

15. The method of claim 10, wherein epoxy is employed for the encapsulating of step (b).

16. The method of claim 1, wherein step (c) comprises the step (c1) of treating the product of step (b) until the soluble substrate is removed from the product of step (b).

17. The method of claim 15, wherein step (c) comprises the step (c1) of treating the product of step (b) until the soluble substrate is removed from the product of step (b).

18. The method of claim 17, wherein said treating comprises bathing the product of step (b) in an aqueous solution.

19. The method of claim 11, wherein step (c) comprises the step of treating the product of step (b) in a non-aqueous solution until the adhesive is removed from the product of step (b).

20. The method of claim 10, wherein step (c) comprises the step of treating the product of step (b) until the adhesive is removed from the product of step (b).

21. The method of claim 16, wherein step (c) further comprises the step (c2) of treating the product of step (c1) until the adhesive is removed from the product of step (c1).

22. The method of claim 17, wherein step (c) further comprises the step (c2) of treating the product of step (c1) until the adhesive is removed from the product of step (c1).

23. The method of claim 18, wherein step (c) further comprises the step (c2) of bathing the product of step (c1) in a non-aqueous solution until the adhesive is removed from the product of step (c1).

24. The method of claim 23, wherein said non-aqueous solution is comprised of acetone.

25. The method of claim 1, wherein the semiconductor chips comprises at least one micro chip.

26. The method of claim 1 further comprising a grid waffle having at least one window, wherein at least one of the semiconductor chips is seated in said at least one window.

27. The method of claim 26, further comprising a heat sink attached to said at least one microchip.

28. The method of claim 1, further comprising the step (d) of milling the product of step (c) until it has two opposed faces parallel to each other.

29. A packaging method for multichip circuits comprising the steps of:
   (1.) applying with an adhesive at least one selected device to a soluble substrate;
   (2.) dissolving excess adhesive from the product of step 1,
   (3.) moderately heating the product of step 2;
   (4.) encapsulating with encapsulant the product of step 3;
   (5.) dissolving the soluble substrate from the product of step 4; and
   (6.) dissolving the adhesive from the product of step 5.

30. The method of claim 29, further comprising the step of curing the encapsulant of step 4, before step 5.

31. The method of claim 29, wherein said at least one device comprised at least one microchip and a grid waffle having at least one window, wherein said at least one micro chip is seated in said at least one window.

32. The method of claim 31, further comprising a heat sink attached to said at least one microchip.

33. The method of claim 29, wherein said adhesive is a polymer.

34. The method of claim 29, wherein said encapsulant is epoxy.

* * * * *

UNITED STATES PATENT AND TRADEMARK OFFICE
CERTIFICATE OF CORRECTION

PATENT NO. : 5,032,543

DATED : July 16, 1991

INVENTOR(S) : Jerry G. Black et al.

It is certified that error appears in the above-identified patent and that said Letters Patent is hereby corrected as shown below:

On the title page, Item [56],

Under References Cited, U.S. PATENT DOCUMENTS, "Hasagawa" should be --Hasegawa--.

Figure 1, "18" has no arrow directing it to the appropriate location.

Col. 1, line 34, "through hole" should be --through-hole--.

Col. 2, lines 16-17, "chip to wafer" should be --chip-to-wafer--.

Col. 2, line 27, "accomodate" should be --accommodate--. (Our Error)

Col. 4, line 31, "Spun on" should be --Spun-on--.

Col. 4, line 32, "althouqh" should be --although--.

Col. 4, line 33, "set up" should be --set-up--.

Col. 4, lines 46-47, "non aqueous" should be --non-aqueous--.

Col. 4, line 58, "Hence" should be --For example--.

UNITED STATES PATENT AND TRADEMARK OFFICE
CERTIFICATE OF CORRECTION

PATENT NO.    : 5,032,543

DATED         : July 16, 1991

INVENTOR(S)   : Jerry G. Black et al.

It is certified that error appears in the above-identified patent and that said Letters Patent are hereby corrected as shown below:

Col. 5, line 61, "2" should be --27--.

Col. 6, line 44, "althouqh" should be --although--.

Signed and Sealed this

Eighteenth Day of May, 1993

Attest:

MICHAEL K. KIRK

Attesting Officer     Acting Commissioner of Patents and Trademarks